US008837841B2

(12) United States Patent
Luttmer

(10) Patent No.: US 8,837,841 B2
(45) Date of Patent: Sep. 16, 2014

(54) METHOD FOR COMPRESSING AND DECOMPRESSING DIGITAL DATA

(75) Inventor: Maurice L. M. Luttmer, Velden (NL)

(73) Assignee: OCE Technologies B.V., Venlo (NL)

( * ) Notice: Subject to any disclaimer, the term of this patent is extended or adjusted under 35 U.S.C. 154(b) by 182 days.

(21) Appl. No.: 13/287,702

(22) Filed: Nov. 2, 2011

(65) Prior Publication Data
US 2012/0113466 A1 May 10, 2012

(30) Foreign Application Priority Data
Nov. 9, 2010 (EP) .................................... 10190465

(51) Int. Cl.
G06K 9/36 (2006.01)
H04N 1/411 (2006.01)
H03M 7/30 (2006.01)
H04N 1/41 (2006.01)

(52) U.S. Cl.
CPC ........... H03M 7/3086 (2013.01); H04N 1/4115 (2013.01); H04N 1/4105 (2013.01)
USPC ............ 382/232; 345/502; 358/1.9; 382/245; 382/274

(58) Field of Classification Search
None
See application file for complete search history.

(56) References Cited

U.S. PATENT DOCUMENTS

| 5,113,494 A * | 5/1992 | Menendez et al. ............. 345/502 |
| 5,798,718 A | 8/1998 | Hadady |
| 6,272,256 B1 * | 8/2001 | Arps et al. ..................... 382/245 |
| 2003/0107753 A1 * | 6/2003 | Sakamoto ....................... 358/1.9 |
| 2005/0152610 A1 | 7/2005 | Hagiwara et al. |
| 2006/0041840 A1 * | 2/2006 | Blair et al. ..................... 715/513 |
| 2006/0078222 A1 * | 4/2006 | Hwang ......................... 382/274 |
| 2007/0154106 A1 | 7/2007 | Koziarz |

FOREIGN PATENT DOCUMENTS

| EP | 1318665 A2 | 6/2003 |
| EP | 1578019 A2 | 9/2005 |

* cited by examiner

Primary Examiner — Tsung-Yin Tsai
(74) Attorney, Agent, or Firm — Birch, Stewart, Kolasch & Birch, LLP

(57) ABSTRACT

A method of compressing and decompressing digital data that is especially suitable for halftoned image data in which every bit represents the marking of a receiving material by ink or toner is provided. The method is lossless and balances the use of memory, the processing time, the compression factor and the cost of hardware resources. The recurrence of data in halftoned images on which the smaller data size of the compressed data is based, is caused by the use of a halftone dither matrix. Various halftone dither matrices may be used in the halftoned image. The method is adapted to employ the characteristics of a specific halftone dither matrix by applying a dynamic set of offset values, in which an offset value represents a number of words between the current word of digital data and an identical, previously processed word.

16 Claims, 4 Drawing Sheets

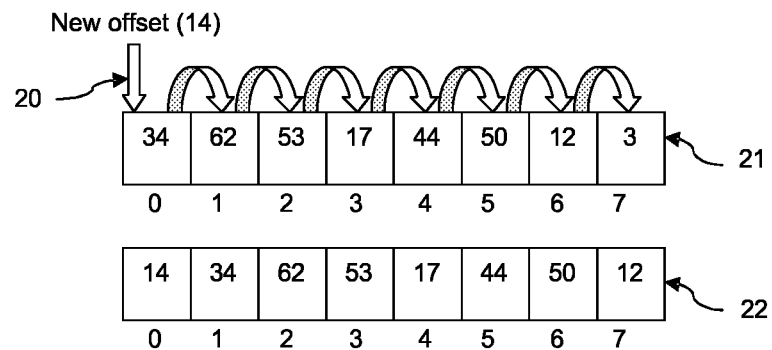
Fig. 3A
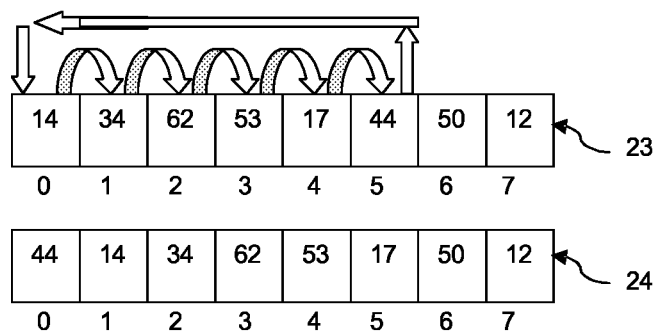
Fig. 3B
Fig. 4

METHOD FOR COMPRESSING AND DECOMPRESSING DIGITAL DATA

CROSS-REFERENCE TO RELATED APPLICATIONS

This application claims priority under 35 U.S.C. §119 to Application No. 10190465.4, filed on Nov. 9, 1010, the entirety of which is expressly incorporated herein by reference.

BACKGROUND OF THE INVENTION

1. Field of the Invention

The present invention relates to a method for compressing digital data to compressed data, which comprises a stream of data words and control words. The present invention further relates to a method of decompressing compressed data to digital data and to a computer program product, an application specific programming unit, a controller computer and a print engine, configured to perform said method 2. Background of the Invention A known print system comprises a print engine that marks a receiving material with toner or ink to form a printed image. The input data may come from a scanner or another source of digital images. Access to the print engine is controlled by a networked general purpose computer that uses an application, called a controller program, that accepts print jobs through the network, interprets the print jobs and transforms them to image data, which are sent to the print engine and saved in the computer memory for later reference. A computer with this application may be called a controller computer. The image data comprises the information for the print engine to make a complete printed page. In the print engine, a number of print pixels is defined, which are regularly distributed and associated with a position on the receiving material. For each print pixel, the image data comprises information whether or not to mark the receiving material with toner or ink. In a bitonal print engine the amount of toner or ink for each print pixel is fixed and therefore this information is represented by one bit. In contrast, in a multilevel print engine, various amounts of toner or ink may be associated with a print pixel and more than one bit is necessary to represent this information in the image data.

One of the transformations that is performed on the print jobs is known as (digital) halftoning, which is part of the Raster Image Processing. In this process, the content of the bits that determine the distribution of toner or ink over the page is established. One familiar type of halftoning is dithering, that employs a matrix of thresholds to which the pixel values that come from a rasterizing process are compared. The threshold values in the matrix define a screen that is apparent in the printed image. The matrix, in general being smaller than the image, is shifted in two directions to obtain a threshold value for each pixel. The image data after halftoning are bitonal data, when every bit signifies one of two tone levels in the image for every print pixel.

The image data that are generated in the controller program are transferred to the print engine. Over the years, the number of print pixels in the print engines has steadily increased and accordingly the amount of image data has increased. However, depending on the speed of the print engine, i.e. the number of printed pages per minute, there is only limited time for data transfer. An A4 page comprising 1200 dpi in both directions, having two tone levels per print position, has a bitonal data size of about 140 Mbit. Therefore the transfer speed of the data bus between the controller computer and the print engine for black/white images of a 60 pages per minute print system has to exceed 140 Mbit/s. In a CMYK color printer this speed is four times as high, as each process color is associated with a bitonal image of this data size. To reduce the necessary transfer speed, it is beneficial to consider compressing the bitonal data.

A number of constraints restrict the use of known compression schemes. First of all there may be only limited processing power, because the CPU of the controller computer is involved in more tasks than compressing. Secondly, the decompression scheme is preferably simple, referencing only a part of the processed data, because only these are still kept in memory, which has only a finite size. Further, the compression factor, which is the ratio between the amount of compressed data relative to the amount of original data, for pages with little information, may be around 0.01, but for pages comprising a complex full-page picture, the compression factor should not exceed 0.5. A low compression factor indicates that the compressed data is much smaller than the original data, whereas a high compression factor indicates that the compressed data is hardly smaller than the original data. A final constraint is that the compression is preferably lossless to make sure that there is no visible difference between the printing of the original image data and the printing of the compressed data after decompression. Familiar lossless run-length encoding schemes, like ITU-T Group4 compression, are not capable of combining these constraints. Run-length encoding schemes typically use data words that correspond to the original data and control words that include a run-length code to indicate the number of times a data word is repeated or copied. This may be combined with backward referencing to already processed data words. This requires specific control codes that are taken up in the control words. It is advantageous for the compression if a word occurs repeatedly in the stream of data words, because the control code is usually shorter than the original data word. In hardware-implemented methods, words may have a length of 1 bit, or 8 bits (1 byte), but in software-implemented methods words often have a length of 2, 4, or even 8 bytes, corresponding to a preferred word length of the CPU.

An object of the present invention is to find a lossless compression scheme that combines the specific demands for the communication between a controller computer and a print engine.

SUMMARY OF THE INVENTION

According to the present invention, a method for compressing digital data to compressed data, which comprises a stream of data words and control words, comprises the steps of receiving a current word of digital data; and comparing the current word of digital data to at least one previously processed word of digital data to establish if the words are identical, wherein the previously processed word is selected based on a dynamic set of offset values, an offset value being associated with a number of words between two digital data words, and, if an identical previously processed word of digital data is found, affixing to the compressed data a control code including an indication of the offset value.

The use of a dither matrix in a halftoning process may lead to recurring data words, which are identical, because of the repeating character of the halftoning process. However, it is not known how many words there are between the current data word and an identical previously processed word. One of the reasons is the use of different halftoning dither matrices. Once a pair of identical words with a certain number of words between them has been found, the chance of finding another pair of identical words with the same number of words between them is substantially higher. Comparing all already processed words would take too much processor time. Therefore saving an offset value that is associated to a pair of identical words, in a dynamic set of offset values, results in a faster compression method.

In an embodiment, the dynamic set of offset values comprises a number of offset values for which most recently identical digital data words have been found. The dynamic set of offset values is updated with a most recently used offset value to increase the chance of finding a pair of identical words, for example when different dither matrices are used.

In an embodiment, the dynamic set of offset values further comprises a counter that is cyclically incremented each time it is addressed to output an offset value. This provides for new possible offset values that otherwise would not be tried. When an identical pair of words for an offset value, obtained from the counter, is found, the offset value is taken up in the most recently used offset memory. This provides a learning effect to the method, which improves the compression factor for different dither matrices, without increasing the processing time.

In an embodiment, the digital data are bitonal image data. For this type of digital data, each word comprises a number of bits, wherein each bit corresponds to a print pixel. Usual compression methods do not satisfy, because of the locally varying values in the dither matrix, whereas the use of offset values employs the repetitiveness of the halftoning process which has resulted in the bitonal data.

In a further embodiment, the method uses words of four bytes. This makes optimal use of the processing power of a present-day CPU.

In a further embodiment, the dynamic set of offset values comprises eight values. This gives eight codes that are to be comprised in the code words, and optimizes between compressing with a low compression factor using a long processing time and compressing with a high compression factor using a short processing time.

In an embodiment, an offset value is associated with a number of image lines between two identical previously processed words. This gives an efficient coding of the offset values that connects to the repetition of the dither matrices.

According to the invention, a method of decompressing compressed data to digital data, the method comprising the steps of receiving a current word of compressed data, comprising data words and control words; retrieving an indication of an offset value from a control code in a control word, the offset value being associated with a number of words between two digital data words, the indication referring to a dynamic set of offset values from which the offset value is retrieved; retrieving a previously processed data word from a set of previously processed words based on the retrieved offset value; and affixing to the digital data the retrieved previously processed data word. This decompressing method is an inverse of the compression method according to the present invention. The dynamic set of offset values has the same status at the time of compressing and decompressing, in order to refine the same offset values.

In an embodiment, the dynamic set of offset values comprises a number of offset values for which most recently identical digital data words have been found. Thus, the dynamic set is updated every time an offset value from the set has been used.

The present invention may be embodied in an application specific programming unit configured to apply either a compression or a decompression method according to the steps described above. The present invention may also be embodied in a computer program product on at least one non-transitory computer-readable storage medium, comprising instructions for the execution of a compression or a decompression method according to the steps described above. These products provide an inexpensive way of executing the methods for compressing and decompressing digital data.

The present invention may also be embodied in a controller computer that is configured to accept and interpret print jobs and to transform them into image data, wherein the controller computer comprises a module for compressing the image data to compressed data, which comprises a stream of data words and control words, comprises the steps of receiving a current word of digital data; comparing the current word of digital data to at least one previously processed word of digital data to establish if the words are identical, wherein the previously processed word is selected based on a dynamic set of offset values, an offset value being associated with a number of words between two digital data words; and, if an identical previously processed word of digital data is found, affixing to the compressed data a control code including an indication of the offset value.

The present invention may further be embodied in a print engine that is configured to mark receiving material by a print process, wherein it comprises a module for decompressing compressed data to digital data, wherein the steps are comprised of receiving a current word of compressed data, comprising data words and control words, retrieving an indication of an offset value from a control code in a control word, the offset value being associated with a number of words between two digital data words, the indication referring to a dynamic set of offset values from which the offset value is retrieved; retrieving a previously processed data word from a set of previously processed words based on the retrieved offset value; and affixing to the digital data the retrieved previously processed data word. This engine is configured to work together with a computer controller that transfers compressed image data.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 3A and 3B show diagrams illustrating the updating of the "mru" memory;

FIG. 4 shows an example of an image with bitonal data; and

DETAILED DESCRIPTION OF THE PREFERRED EMBODIMENTS

Figure 1:
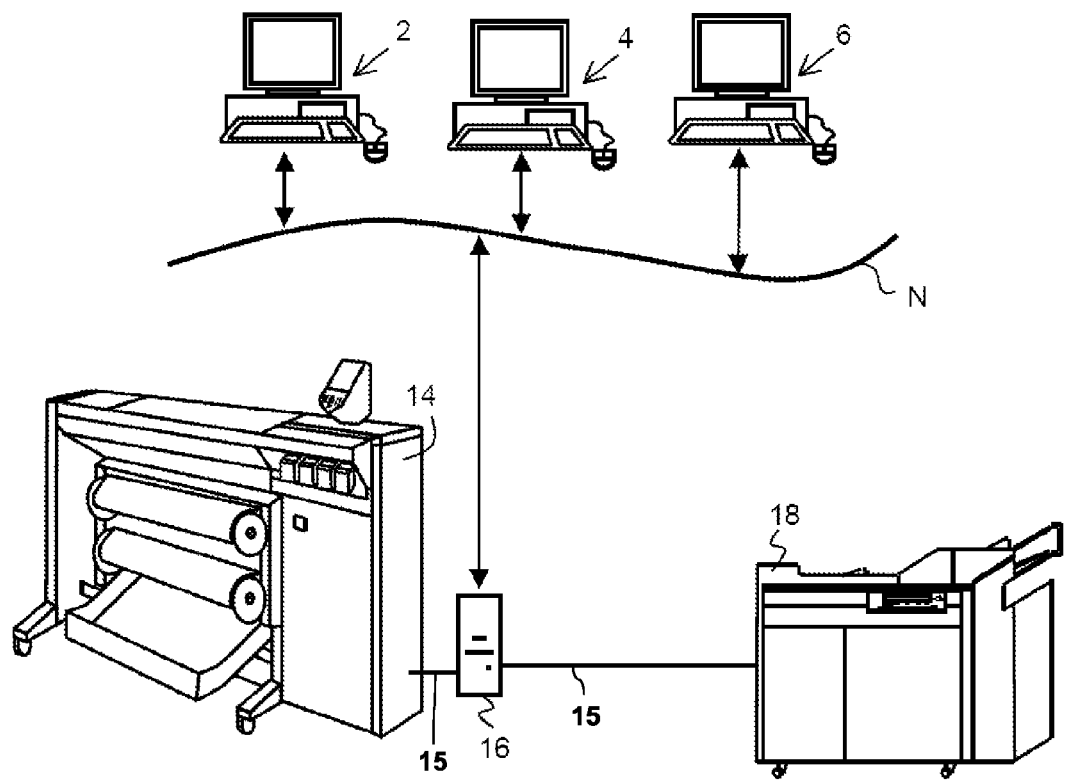
FIG. 1 shows a printing system in which an embodiment of the method according to the present invention is used.

The present invention will now be described with reference to the accompanying drawings, wherein the same reference numerals have been used to identify the same or similar elements throughout the several views.

The printing system in FIG. 1 comprises a number of workstations (2, 4, 6) that are connected to a controller computer 16 through a network N. On the workstations, print jobs are prepared involving documents in various formats and various sizes. The data in these documents originate from different sources, such as scanners, digital camera's and computer applications. The print jobs may be sent to the controller computer where the jobs are analyzed and the documents converted into image data that are appropriate to be accepted by one of the printers connected to the controller computer. In the present embodiment, a printer 14 for large size documents, such as CAD drawings and banners, is available and a printer 18 for office size documents, is connected to the controller computer 16 by a means for data transfer 15. In the process of converting, the documents are rasterized and rendered, employing the process colors of the printer to be used. In this process, also a number of methods may be applied that improve the appearance of the image on the receiving material that is used in the printer. The image data are compressed before being sent to the printer and possibly saved on a non-volatile memory, such as a hard disk.

Figure 2:
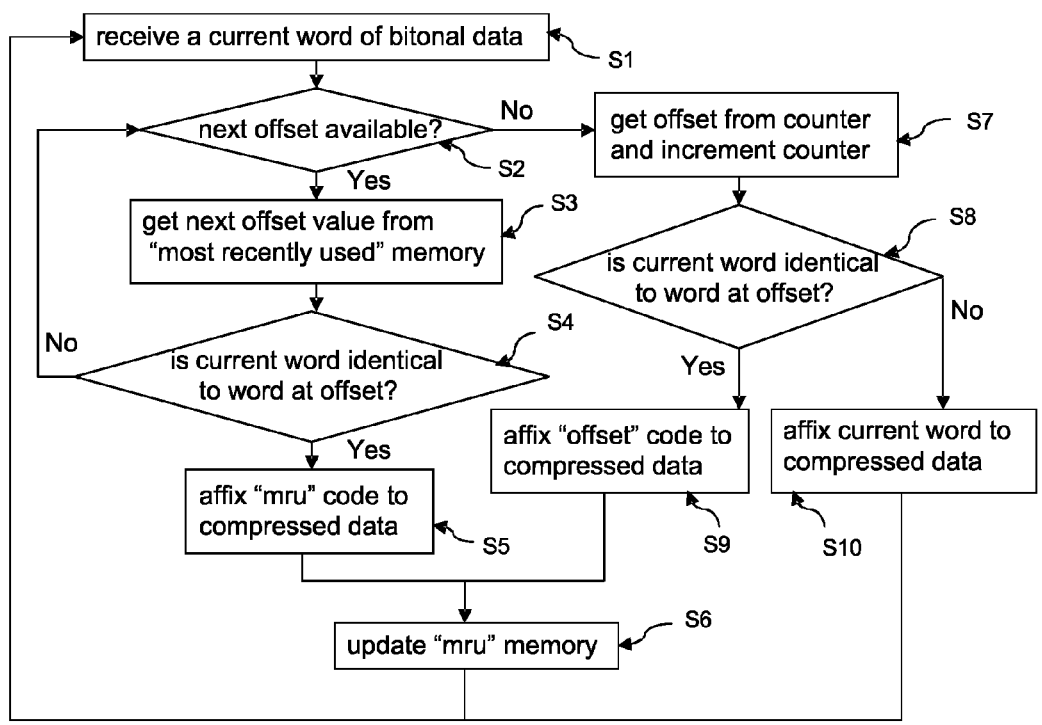
FIG. 2 shows a flow diagram for an embodiment of the compression method.

In FIG. 2 an embodiment of the compression method according to the present invention is shown. In step S1 a current word (4 bytes) of bitonal data is received. This word comprises the image data of 32 print pixels. The current word is compared to a number of already processed words that are kept in a buffer memory, which for this embodiment has a size of 64 Kbyte. This memory is sufficient for 37 lines of images having 1200 print pixels per inch and therefore 438 words in a line of 29.7 cm. Only a limited number of comparisons are made, dependent on offset values that are kept in the "most recently used offset" memory ("mru" memory), which in this embodiment comprises eight values. An offset value refers to the number of image lines between a previously processed word and the current word. If a next offset value is available (S2, "Yes"), it is retrieved from the "mru" memory (S3). The word in the buffer memory referred to by the offset value is compared to the current word (S4). If it is not identical ("No"), a next offset value is tried. If it is identical ("Yes") an "mru" control code is affixed to the compressed data that indicates that the current word can be obtained from the buffer (S5). Note that several control codes are collected in a control word, because the control codes usually have a smaller size than a control word. If no offset values are available (S2, "No"), which is in the present embodiment after eight values have been tried, a next offset value is obtained from a counter that has a value in the range of the available offset values (S7). The counter is incremented in order to have a different value available next time. In the same way as in step S4, the offset value is used to find a word in the buffer memory to compare with the current word (S8). If these are identical ("Yes"), an "offset" control code, including the offset value from the counter, is affixed to the compressed data, indicating that the current word can be retrieved from the buffer at the offset position. If these are not identical ("No"), the current data word is affixed to the compressed data.

The control codes that are used to illustrate the method according to the present invention in this embodiment are summarized in Table 1. Other codes, such as run-length codes, may be added to obtain further compression. The control instructions are coded in nibbles, half the size of a byte. Several control codes are accumulated to form a complete control word of 4 bytes.

TABLE 1

Control instructions in control words

| value | next nibble | acronym | interpretation |
|-------|-------------|---------|----------------|
| 0XXX  | —           | mru'x'  | next data word found with offset in mru[x] |
| 10YY  | YYYY        | offset  | next data word found with offset indicated by y + 1 |
| 11ZZ  | ZZZZ        | copy    | next z + 1 data words found in compressed data |

The capitals "XXX" indicate a binary expression for the number x that is in the range of 0 to 7. In a similar way "YYYYYY" and "ZZZZZZ" indicate numbers y and z in the range of 0 to 63.

The use of an "mru" code or an "offset" code results in a step to update the "mru" memory (S6). Updating of the "mru" memory is illustrated in FIGS. 3A and 3B. In FIG. 3A the status of the "mru" memory 21 is changed due to the availability of a new offset value 20 that is used in an "offset" code. The most recently used offset is placed at the first position, indicated by "0". The original content of the memory is shifted one position, removing the last offset value from the memory 22. In FIG. 3B an "mru5" code has been used from "mru" memory 23, making it necessary to take out the offset value from mru[5], shift the mru values from the lower positions one place up, and inserting the offset value at the first position in 24.

In FIG. 4, an example of a digital image (25) having five lines is given. Each line is associated with 32 print positions, which are, for illustrative purposes, grouped in words of one byte. Their value is represented by a decimal number in the range of 0 to 255. Using the algorithm of the embodiment as illustrated in FIG. 2, the following codes are generated.

|              |     |     |     |     |    | mru[ ] | | |
|--------------|-----|-----|-----|-----|----|---|---|---|
| 4 data words | 195 | 120 | 148 | 112 | 63 | x | x | x |
| offset 1     | 128 | 120 |     |     |    | 0 | x | x |
| 4 data words | 195 | 32  | 94  | 110 | 44 | 0 | x | x |
| offset 2     | 129 | 148 |     |     |    | 1 | 0 | x |
| mru 1,       |     | 94  |     |     |    | 0 | 1 | x |
| mru 0        | 32  | 110 |     |     |    | 0 | 1 | x |
| mru 1,       |     | 120 |     |     |    | 1 | 0 | x |
| mru 1        | 33  | 148 |     |     |    | 0 | 1 | x |
| offset 3     | 130 | 112 |     |     |    | 2 | 0 | 1 |
| mru 0,       |     | 63  |     |     |    | 2 | 0 | 1 |
| mru 2        | 2   | 44  |     |     |    | 1 | 2 | 0 |
| mru 2,       |     | 148 |     |     |    | 0 | 1 | 2 |
| mru 0        | 64  | 112 |     |     |    | 0 | 1 | 2 |
| 1 data word  | 192 | 120 |     |     |    | 0 | 1 | 2 |

In this example, the code words are indicated boldly and the "mru" memory contents are given on the right side. The resulting compressed data will be the following:
195 120 148 112 63 128 195 32 94 1104412932 33 130 2 64 192 120

Note that the last value of "120" cannot be retrieved by an offset value. Information about the number of lines and the number of print positions may be added in a header.

The decompression into the original data is done in an inverse way. A header indicates the width and height of the image. The compressed data as given above is analyzed word for word, using a pointer to point to the next control word. The control code 195 indicates that the next four words are data words. Therefore the pointer is incremented by 5 and four data words are affixed to the output string. The next control code, 128, indicates that a data word is to be obtained from the previous image line, having an offset value 0. The pointer is incremented by 1 and one data word is affixed to the output string. A new control code 195 is encountered, which results in affixing four data words to the output string. The control code 129 results in retrieving a data word from two image lines above the current one. The control word 32 results in two data words, retrieved through the pointers to the "mru" array that is updated for every offset instruction. Further control codes can be readily converted to the data words of the original image in FIG. 4. The size of the buffer in which the previously processed data words are stored, depends on the number of print pixels per line and the number of lines that need to be referred to. In a practical embodiment, there are 14,000 print pixels per image line and 37 lines are sufficient for the several dither matrices used. This means a buffer memory of 64 Kbyte may be used.

Figure 5:
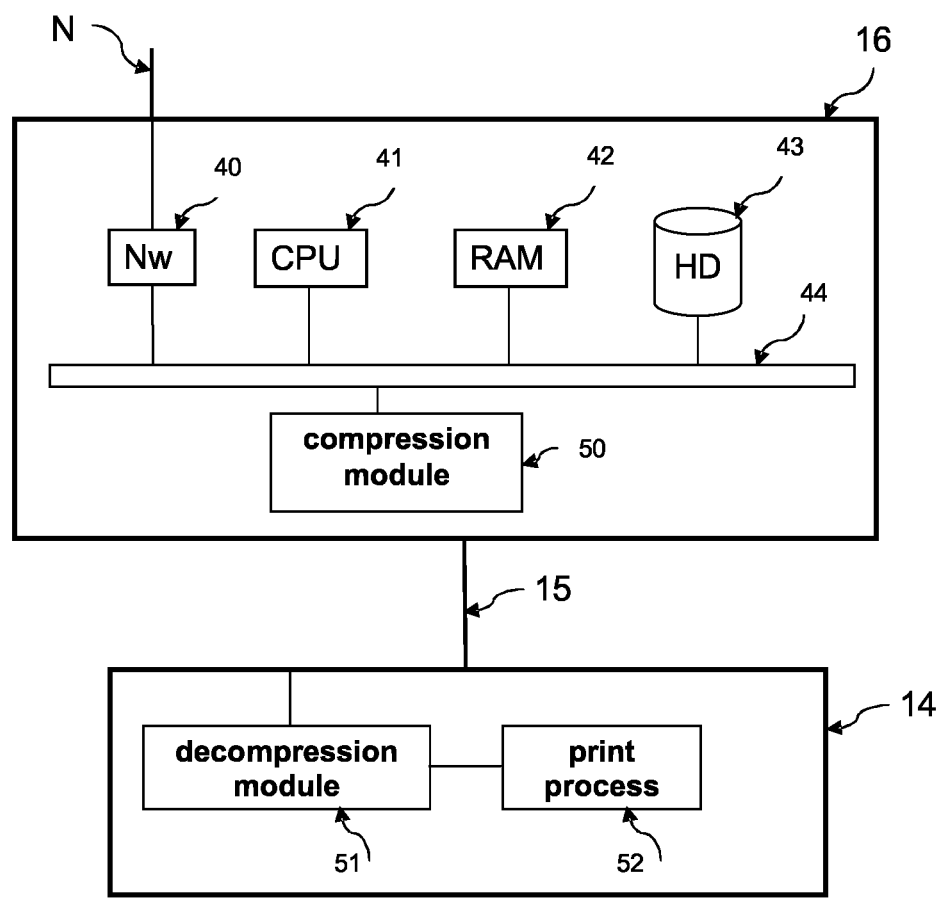
FIG. 5 shows a diagram of a print system with compression and decompression modules.

In FIG. 5, a print system is shown, comprising a controller computer (16), a print engine (14) and a means for data transfer (15). The controller computer is connected to the network (N) and comprises a network connection module (40), a central processing unit (41), a volatile memory module (42), a non-volatile memory module (43) and a compression module (50), all connected to a data-bus (44). The controller computer accepts print jobs through the network, interprets the print jobs and transforms them to image data. These are compressed by the compression module and transferred to the print engine through the means for data transfer. The print engine comprises a decompression module (51) and a print process (52) for marking a receiving material with toner or ink. The image data are decompressed and used by the print process.

The compression module is configured to execute a method of compression according to the present invention.

Many different embodiments, including a Field Programmable Gate Array to execute the described method in a limited number of clock cycles and a computer program that executes the various steps on general purpose electronic hardware, can be made. These are embodiments of the invention as described by the appended claims.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for compressing digital data to compressed data, which comprises a stream of data words and control words, the method comprising the steps of:
   receiving a current word of digital data;
   comparing the current word of digital data to at least one previously processed word of digital data to establish if the words are identical, wherein the at least one previously processed word is selected based on a dynamic set of offset values, an offset value being associated with a number of words between two digital data words; and
   if an identical previously processed word of digital data is found, affixing to the compressed data a control code including an indication of the offset value.

2. The method according to claim 1, wherein the dynamic set of offset values comprises a number of offset values for which most recently identical digital data words have been found.

3. The method according to claim 2, wherein the dynamic set of offset values further comprises a counter that adds another offset value to the dynamic set of offset values and that is cyclically incremented each time it is addressed.

4. The method according to claim 1, further comprising the step of affixing the current word as a data word to the compressed data, if no identical previously processed word is found through an offset value from the dynamic set of offset values.

5. The method according to claim 1, wherein the digital data are bitonal image data.

6. The method according to claim 1, further comprising the step of using a word length of four bytes.

7. The method according to claim 1, wherein the dynamic set of offset values comprises eight values.

8. The method according to claim 1, further comprising the step of associating an offset value with a number of image lines between two identical previously processed words.

9. A method of decompressing compressed data to digital data, the method comprising the steps of:
   receiving a current word of compressed data, comprising data words and control words;
   retrieving an indication of an offset value from a control code in a control word, the offset value being associated with a number of words between two digital data words, the indication referring to a dynamic set of offset values from which the offset value is retrieved;
   retrieving a previously processed data word from a set of previously processed words based on the retrieved offset value; and
   affixing to the digital data the retrieved previously processed data word.

10. The method according to claim 9, wherein the dynamic set of offset values comprises a number of offset values for which most recently identical data words have been retrieved.

11. An application specific programmable unit configured to apply the method according to claim 1.

12. An application specific programmable unit configured to apply the method according to claim 9.

13. A computer program product embodied on at least one non-transitory computer-readable storage medium, comprising instructions for the execution of the method according to claim 1.

14. A computer program product embodied on at least one non-transitory computer-readable storage medium, comprising instructions for the execution of the method according to claim 9.

15. A controller computer that is configured to accept and interpret print jobs and to transform them into image data, wherein the controller computer comprises a module for compressing the image data according to the methods of claim 1.

16. A print engine that is configured to receive compressed data through a data transfer module and to use image data in a print process to mark receiving material, wherein the print engine comprises a module for decompressing the compressed data into image data according to the method of claim 9.

* * * * *